United States Patent [19]

Inaba

[11] Patent Number: 5,737,837
[45] Date of Patent: Apr. 14, 1998

[54] MANUFACTURING METHOD FOR MAGNETIC HEAD JUNCTION BOARD

[75] Inventor: Masaichi Inaba, Ushiku, Japan

[73] Assignee: Nippon Mektron Ltd., Tokyo, Japan

[21] Appl. No.: 631,464

[22] Filed: Apr. 12, 1996

[51] Int. Cl.[6] .................... H01R 43/16; H05K 1/18; H05K 3/32; G11B 5/127

[52] U.S. Cl. .................... 29/884; 29/33 M; 29/603.04; 29/603.07; 29/842; 29/852; 29/DIG. 12; 174/254; 216/18; 216/65; 360/137; 427/97; 439/67; 439/77

[58] Field of Search .................... 29/33 M, 603.1, 29/842, 846, 847, 851, 852, 884, DIG. 12, 603.04, 603.06, 603.07; 174/254; 216/18, 65; 360/137; 361/749; 427/97, 98; 439/67, 77, 493

[56] References Cited

U.S. PATENT DOCUMENTS

| | | | |
|---|---|---|---|
| 5,199,881 | 4/1993 | Oshita et al. | 439/493 X |
| 5,361,491 | 11/1994 | Oomachi et al. | 29/852 |
| 5,434,362 | 7/1995 | Klosowiak et al. | 174/254 |
| 5,495,377 | 2/1996 | Kim | 439/67 X |
| 5,508,860 | 4/1996 | Takagi et al. | 360/137 X |
| 5,509,203 | 4/1996 | Yamashita | 29/884 X |
| 5,525,760 | 6/1996 | Rohatgi et al. | 439/77 X |
| 5,541,788 | 7/1996 | Ishida et al. | 439/67 X |
| 5,623,758 | 4/1997 | Brooks, Jr. et al. | 29/603.01 |

FOREIGN PATENT DOCUMENTS

| | | | |
|---|---|---|---|
| 63-113917 | 5/1988 | Japan | G11B 5/60 |
| 4026185 | 1/1992 | Japan | 439/67 |
| 4-219618 | 8/1992 | Japan | G11B 5/60 |
| 4301387 | 10/1992 | Japan | 29/33 M |

OTHER PUBLICATIONS

IBM Technical Disclosure Bulletin, vol. 7, No. 3, Aug. 1964, p. 182.
IBM Technical Disclosure Bulletin, vol. 25, No. 1, Jun. 1982, pp. 370–371.
"Card Edge Connectors Using Slotted Flexible Circuit" Research Disclosure, No. 344, Dec. 1992, England.

*Primary Examiner*—Peter Vo
*Attorney, Agent, or Firm*—Alix, Yale & Ristas, LLP

[57] ABSTRACT

A method of manufacturing a magnetic head junction board wherein a laminated plate having a springy metal layer and a conductive layer is prepared. A circuit wiring pattern is formed on the conductive layer by photoetching and the springy metal layer is formed into a predetermined shape by etching. The circuit wiring pattern is provided with a surface protecting layer which leaves holes exposed at the ends of the circuit wiring pattern. Then, the holes are filled with conductive metal to form bump-shaped terminals such that the ends on one side jut out of the surface protecting layer. Lastly, the springy metal layer is bent into a predetermined shape so that the bump-shaped terminals face against each other. Alternative process are also disclosed.

12 Claims, 4 Drawing Sheets

MANUFACTURING METHOD FOR MAGNETIC HEAD JUNCTION BOARD

BACKGROUND OF THE INVENTION

1. Field of the Invention

The present invention relates to a magnetic head junction board which is useful as a means for electrically connecting a wiring pattern on a magnetic head suspension, which is used for a magnetic disk unit or the like, and a wiring pattern on a read/write amplifier substrate and a manufacturing method for the same.

2. Description of the Related Art

This type of magnetic disk unit is equipped with at least a single rotary disk for magnetically recording information, a magnetic head device for reading data from or writing data to the tracks on the disk, and a head positioning actuator which is connected to the head device to move the head device to a desired track and which also holds the head device above the track.

A conventional magnetic head suspension assembly has been disclosed, for example, in Japanese Patent Laid-Open No. 63-113917. In the disclosed art, the magnetic head device is attached to gimbals with epoxy resin or the like and the gimbals is attached to a suspension by means of laser welding or the like. A gold plated copper wire and the like provided with urethane coating or the like is connected by ultrasonic welding or soldering or the like to an electrode formed on a magnetic head device, thereby constituting the component of a leader wire for a signal to an external circuit. The leader wire component is turned a predetermined times into a coil and contained in a flexible tube made of insulating resin and the tube is installed on the suspension by crimping a part of the suspension or by other similar means.

In such a magnetic head suspension assembly, the connection between the electrode on the magnetic head device and the leader wire is extremely inefficient because of restricted workability, making it difficult to achieve higher productivity. The recent increasing number of terminals due to the decreasing sizes of magnetic head devices and the increasing use of MR devices are making the problem more serious. There is another problem in that the rigidity of the aforesaid leader wire component adversely affects the levitation of the magnetic head device, preventing the achievement of an optimum levitation attitude thereof. Further, the leader wire component is subjected to the wind pressure due to the air flow induced by the rotation of the recording medium, also adversely affecting the levitation attitude of the magnetic head device.

To solve the problem stated above, Japanese Patent Laid-Open No. 4-219618 has disclosed an art which provides a suspension made integral with circuit wiring which combines a leader wire component and a suspension mechanism.

In this art, however, a lead wire used for connecting a magnetic head device and an amplifier as in the past is used for an electrical means for connecting a circuit wiring pattern, which is formed integrally on the suspension, and a read/write amplifier substrate. This connecting means makes it difficult to achieve reduced cost by automation as it did when it was previously used for the connection with the magnetic head device.

SUMMARY OF THE INVENTION

Accordingly, it is an object of the present invention to provide a magnetic head junction board ideally suited as a means for configuring an inexpensive magnetic recording unit by permitting automated electrical connection between the circuit wiring on a magnetic head suspension, which combines the circuit wiring and the suspension into one piece via a flexible insulating layer, and a read/write amplifier substrate, and a manufacturing method for the same.

To this end, according to the present invention, there is provided a magnetic head junction board equipped with a flexible circuit board, the ends of which are uniformly connected to the inside of a springy metal layer, which has been bent to a U shape having a predetermined width, and the rest of which extends in a predetermined width outward from the springy metal layer, wherein the flexible circuit board is equipped with bump-shaped connecting terminals on the opposed bent sections, the ends on one side of which are electrically connected to the ends of the circuit wiring patterns formed on the flexible circuit board and the ends on the other side of which jut outward. The connecting terminals are electrically connected to the terminal of the magnetic head suspension, which is made integral with circuit wiring, by the clamping force of the springy metal layer, thereby permitting the electrical connection between the magnetic head suspension and the read/write amplifier substrate. This magnetic head junction board enables the flexible circuit board to provide a surface protecting layer for covering the circuit wiring pattern in the area excluding the jutting connecting terminals.

The magnetic head junction board can be produced according to the following process. A laminated plate is prepared, in which one surface of the flexible insulating base material has a springy metal layer and the other surface has a conductive layer. A desired circuit wiring pattern is formed on the conductive layer of the laminated plate by photoetching or other similar means and the springy metal layer is formed into a predetermined shape by etching. The outer surface of the circuit wiring pattern is provided with a surface protecting layer by using a photosensitive resin or the like to make holes to partly expose the ends of the circuit wiring patterns at the sections which correspond to both ends of the springy metal layer. Then, the aforesaid holes are filled with conductive metal by plating or the like to form bump-shaped terminals, the ends on one side of which are electrically connected to the circuit wiring patterns and the ends on the other side of which jut out of the surface protecting layer. Lastly, the springy metal layer is bent to a predetermined shape so that the aforesaid connecting terminals face against each other.

According to another process for fabricating the magnetic head junction board, a groove matching a predetermined configuration is formed in the springy metal layer when producing the circuit wiring pattern. Then, the surface protecting layer is formed and the bump-shaped connecting terminals are formed. After that, an excimer laser beam is radiated from the groove side to ablate the portions of the flexible insulating base material and of the surface protecting layer which are positioned in the area of the groove so as to obtain the predetermined configuration. Lastly, the springy metal layer is bent to the predetermined shape as stated above.

DESCRIPTION OF THE PREFERRED EMBODIMENTS

Figure 1:
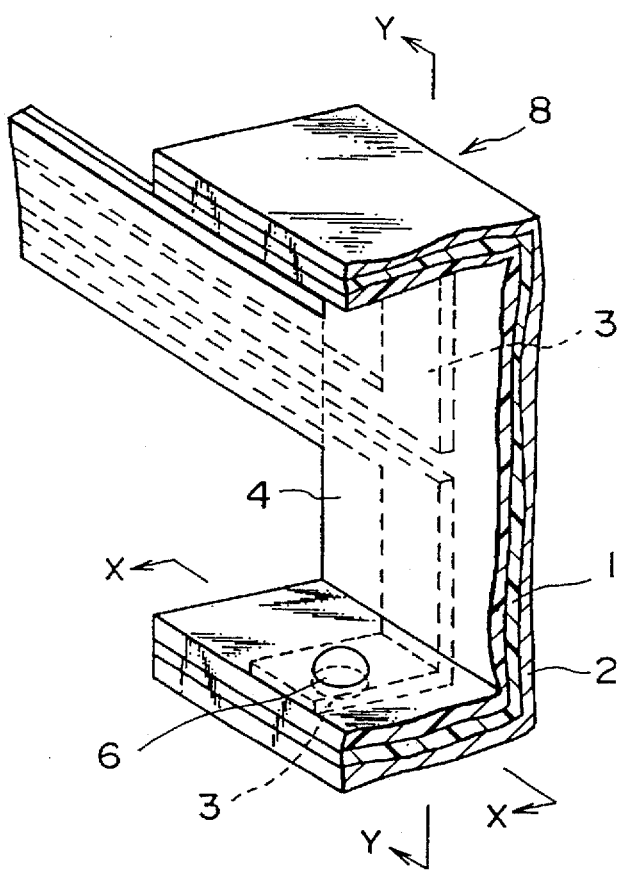
FIG. 1 is a conceptual perspective view of an essential section of a magnetic head junction board in an embodiment according to the present invention.

An embodiment of the present invention will now be described in detail with reference to the accompanying drawings. FIG. 1 is the conceptual perspective view of the essential section of the magnetic head junction board according to an embodiment of the present invention. As it is seen from the cross-sectional view of FIG. 2 taken on line X—X, a flexible insulating base material 1 which uses an appropriate component such as a polyimide film is formed in approximately T shapes in a spread state. Formed around the end outer surface of the flexible insulating base material 1 is a springy metal layer 2 in a predetermined width which is made of a phosphor bronze plate, stainless plate, or the like which has been formed to have a U-shaped cross section.

Figure 2:
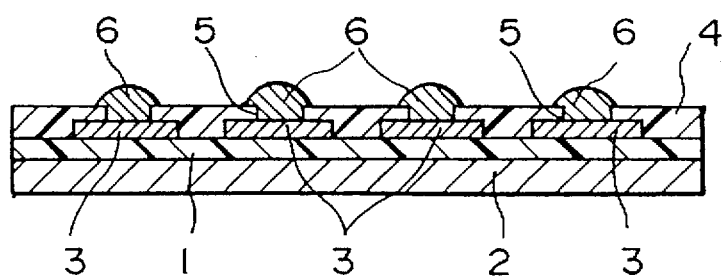
FIG. 2 is a conceptual cross-sectional view taken on line X—X shown in FIG. 1.

Desired circuit wiring patterns 3 are formed on the other outer surface of the flexible insulating base material 1 by etching the conductive layer made of copper foil or the like. In this embodiment, four circuit wiring patterns 3 are terminated at the locations which correspond to the opposed surfaces of the bent springy metal layer 2 as shown in FIG. 2. FIG. 1 shows a top end and a bottom end of the bent circuit wiring patterns 3.

The outer surfaces of these circuit wiring patterns 3 are covered with a surface protecting layer 4 made of an appropriate insulating film or a photosensitive resin. In the positions shown in FIG. 2, holes 5 which partially expose the circuit wiring patterns 3 are formed in the surface protecting layer 4. The holes 5 are filled with a conductive metal by a plating means or the like, so that the ends on one side thereof are electrically connected to the circuit wiring patterns 3 and the ends on the other side thereof form bumps 6 which appropriately jut out of the surface protecting layer 4.

These bumps are provided so that they are pressed to be electrically connected to the terminal formed on the end of a magnetic head made integral with circuit wiring which will be discussed later. The surfaces of the respective bumps 6, which provide such connecting terminals, may be covered with a corrosion-resistant metal film such as gold plating.

Figure 3:
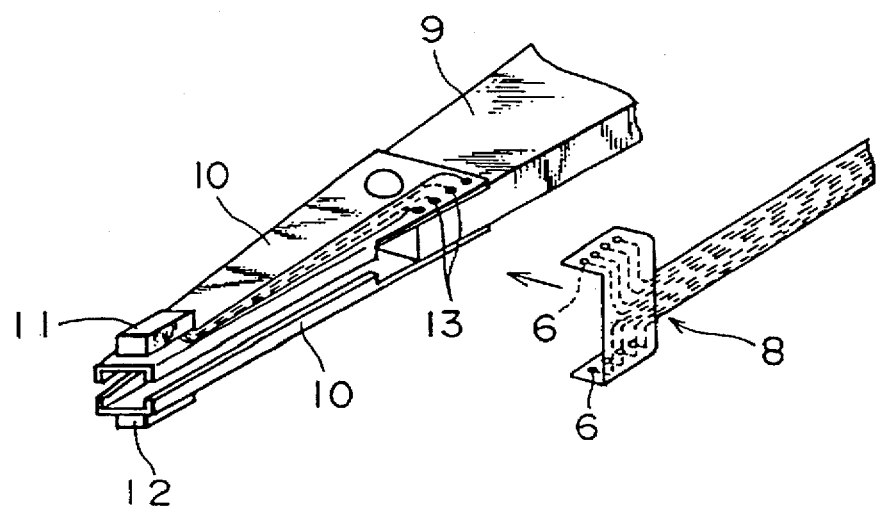
FIG. 3 is an explanatory diagram showing the magnetic head junction board in accordance with the present invention which is to be attached to a suspension made integral with circuit wiring.

As illustrated in FIG. 3, in such a magnetic head junction board 8, the edges of the springy metal layer 2 are bent to the U shape or the like. The aforesaid four bumps 6 are provided on each of the opposed surfaces of the bent portions. The magnetic head junction board 8 further has the flexible circuit board which integrally extend outward from the center of the springy metal layer 2 and the terminal of the flexible circuit board is electrically connected to the read/write amplifier substrate which is not shown.

FIG. 3 is used to describe the connection between the magnetic head junction board 8 in accordance with the present invention and the magnetic head suspension having circuit wiring as an integral piece. In FIG. 3, reference numeral 9 denotes an end of a swinging support arm. The ends of magnetic head suspensions 10 made integral with circuit wiring are connected to both surfaces of the end of the swinging support arm 9 by crimping, spot welding, or the like; magnetic head sliders 11 and 12, which have magnetic head devices, are attached separately to the outer faces of the distal end of the magnetic head suspensions 10.

The outer surfaces of the magnetic head suspensions 10 are provided integrally with an appropriate number of wiring patterns required for the magnetic head devices via appropriate insulating layers. Although the surfaces of the wiring patterns are covered with appropriate surface protecting layers, the ends of the wiring patterns are terminated as four exposed terminals 13 at the portions close to the end of the swinging support arm 9 as illustrated. Thus, when the magnetic head junction board 8 in accordance with the present invention is installed at the location where the terminals 13 of the magnetic head suspension 10 made integral with circuit wiring are formed as illustrated in FIG. 3, the clamping force of the springy metal layer 2 causes the respective terminals 13 associated with the respective bumps 6 to be connected under pressure, thereby achieving secure electrical connection between the magnetic head suspensions 10 made integral with circuit wiring and the read/write amplifier substrate via the magnetic head junction board 8.

FIG. 4A through FIG. 4D show the manufacturing process steps according to an embodiment for fabricating the magnetic head junction board 8 in accordance with the present invention; the manufacturing process diagrams are taken on line Y—Y shown in FIG. 1.

Figure 4A:
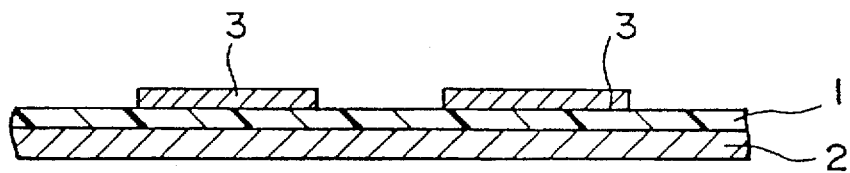
FIG. 4A through FIG. 4D show the manufacturing process steps according to an embodiment for fabricating the magnetic head junction board in accordance with the present invention.

In FIG. 4A, the laminated plate is prepared, in which one surface of the flexible insulating base material 1 has the springy metal layer 2 made of a phosphor bronze plate or stainless plate or the like and the other surface has the conductive layer made of copper foil or the like. The desired circuit wiring patterns 3 are formed on the conductive layer of the laminated plate by photoetching and the springy metal layer 2 is also etched to the predetermined configuration.

Figure 4B:
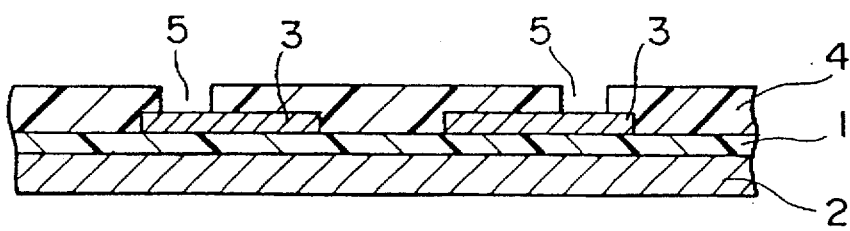

In the next step, as illustrated in FIG. 4B, the outer surfaces of the circuit wiring patterns 3 are provided with the surface protecting layer 4 using an appropriate insulating film or a photosensitive resin. The holes 5 are formed in the surface protecting layer 4 at the locations where the bumps, which will be discussed later, will be formed so that the circuit wiring patterns 3 are partially exposed. The desired surface protecting layer 4 is produced by applying a photosensitive resin such as a photosensitive polyimide resin, photosensitive epoxy resin, photosensitive acrylic resin, or the like, then drying, exposure, developing, and curing in the order in which they are listed.

Figure 4C:
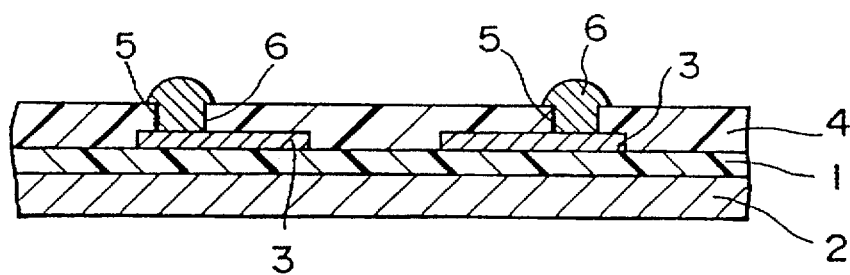

As illustrated in FIG. 4C, the holes 5 in the surface protecting layer 4 are filled with an appropriate conductive metal by plating or the like, so that the ends on one side thereof are electrically connected to the circuit wiring patterns 3 and the ends on the other side thereof form the bumps 6 which appropriately jut out. As necessary, the surfaces of the bumps 6 may be provided with a corrosion-resistant metal film by gold plating or the like.

Figure 4D:
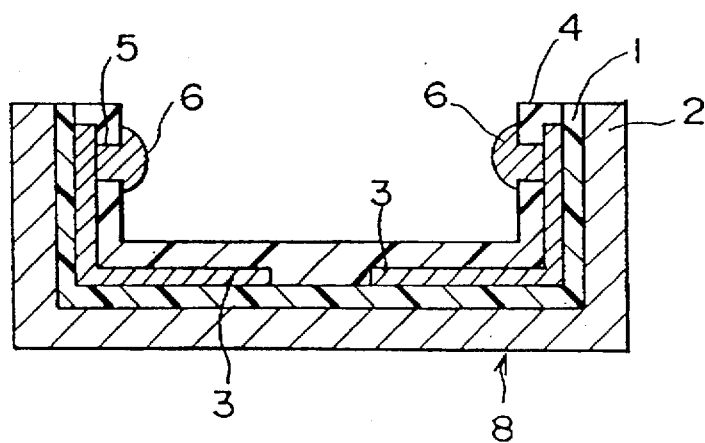

Lastly, after shaping the unit to the predetermined configuration, the edges of the springy metal layer are bent inward to a U shape so that the bumps 6 on both ends face against each other as illustrated in FIG. 4D to complete the magnetic head junction board 8 in accordance with the present invention.

FIG. 5A through FIG. 5E show the manufacturing process steps according to another embodiment for fabricating the magnetic head junction board 8 in accordance with the present invention. As in FIG. 4, the manufacturing process steps shown in FIGS. 5A through 5E also show the views taken along line Y—Y of FIG. 1. This manufacturing process is effective for achieving a smaller junction board while improving the outline machining accuracy at the same time.

Figures 5A, 5B, 5C, 5D, 5E:
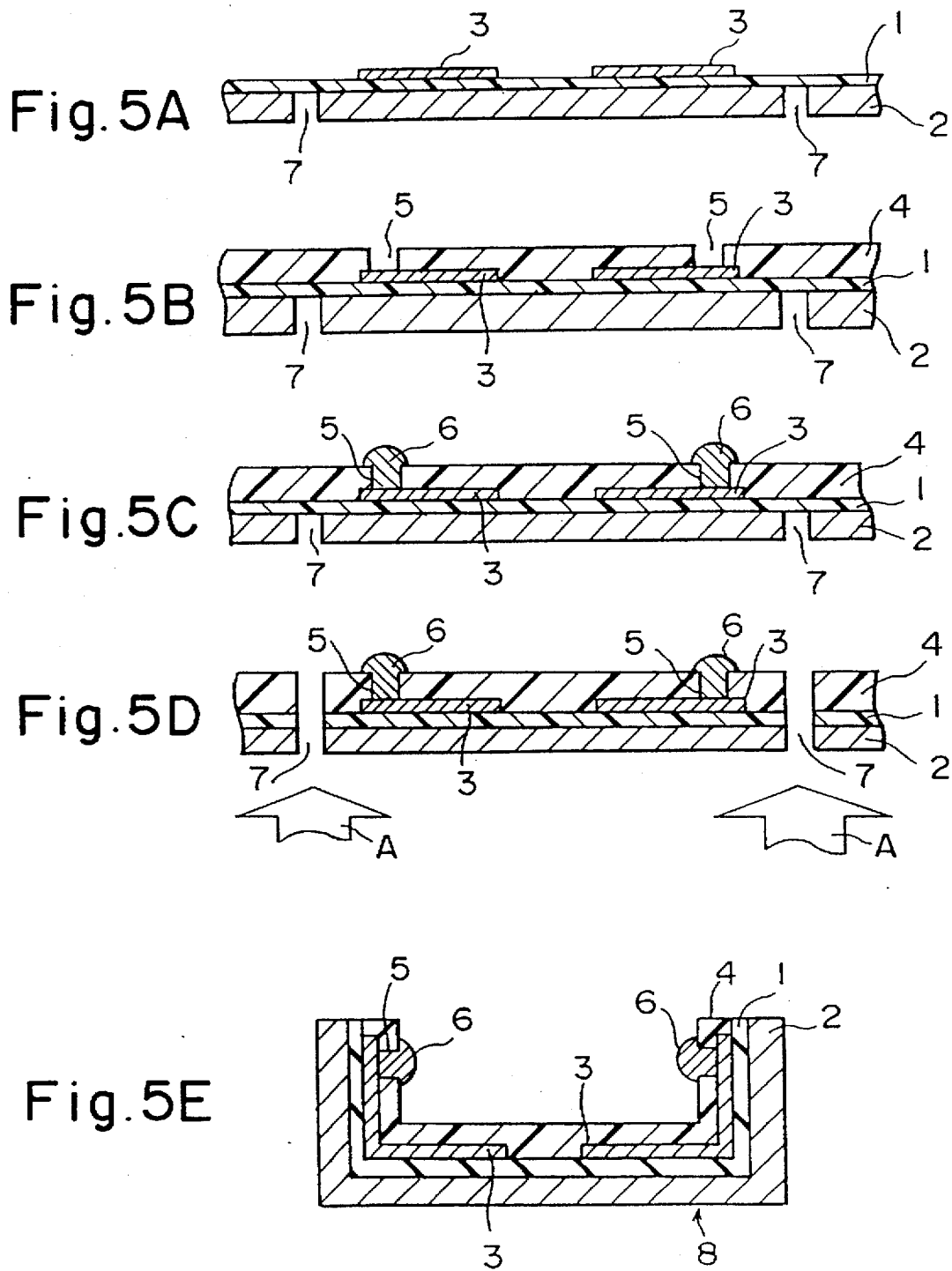
FIG. 5A through FIG. 5E show the manufacturing process steps according to another embodiment for fabricating the magnetic head junction board in accordance with the present invention.

In this embodiment, firstly, as shown in FIG. 5A, the laminated plate is prepared, in which one surface of the flexible insulating base material 1 has the springy metal layer 2 made of a phosphor bronze plate or stainless plate or the like and the other surface has the conductive layer made of copper foil or the like. The desired circuit wiring patterns 3 are formed on the conductive layer of the laminated plate by photoetching and grooves 7 of predetermined shapes are etched in the springy metal layer 2.

According to the similar process shown in FIG. 4B and FIG. 4C, the surface protecting layer 4, which has the holes 5, and the bumps 6 are formed in sequence.

Then, as illustrated in FIG. 5D, excimer laser beam A is radiated from the side of the springy metal layer 2 while utilizing the springy metal layer 2 as a light shielding mask, thereby ablating the portions of the flexible insulating base material 1 and the surface protecting layer 4, which correspond to the areas of the grooves 7, so as to obtain the shape of the unit.

Lastly, as shown in FIG. 5E, the edges of the springy metal layer 2 is bent inward into the U shape so that the bumps 6 on both ends face against each other. This completes the magnetic head junction board 8 in accordance with the present invention.

The magnetic head junction board in accordance with the present invention has the flexible circuit board which has a required number of connecting terminals which jut out in bumps at the locations on the inner side ends of the springy metal layer which has been bent into the U shape so that the bumps face against each other. This makes it possible to easily accomplish the electrical connection between the bump connecting terminals and the terminals of the suspensions made integral with the circuit wiring by utilizing the clamping force of the springy metal layer.

Thus, applying the magnetic head junction board to a magnetic recording unit which employs a suspension made integral with the circuit wiring eliminates the inconvenient wire connection between the circuit wiring of the suspension and the read/write amplifier substrate as in the conventional unit. This permits automated assembly of the unit, thus enabling stable supply of inexpensive magnetic recording units.

What is claimed is:

1. A manufacturing method for a magnetic head junction board, the board being employed for electrically connecting a magnetic head suspension to a circuit wiring pattern on a read/write amplifier substrate, said method comprising the steps of:

preparing a laminated plate, in which one surface of a flexible insulating base material abuts a springy metal layer and the other surface supports a conductive layer;

forming a circuit wiring pattern from the conductive layer of said laminated plate and forming said springy metal layer into a predetermined shape;

providing the outer surface of said circuit wiring pattern with a surface protecting layer which has holes to partly expose ends of the circuit wiring pattern at the portions thereof which correspond to both ends of said springy metal layer;

filling said holes with conductive metal to form connecting terminals, first ends of said terminals being electrically connected to said circuit wiring pattern and the opposite ends of said terminals projecting outwardly beyond the surface of said protecting layer; and bending said springy metal layer to a predetermined shape so that said connecting terminals at said ends of said metal layer face each other.

2. The manufacturing method for a magnetic head junction board according to claim 1, wherein said surface protecting layer is produced by successive steps of applying a photosensitive resin on said outer surface of said circuit pattern; drying said photosensitive resin; exposing the dried photosensitive resin; developing the exposed photosensitive resin and thereafter curing the developed photosensitive resin.

3. The manufacturing method for a magnetic head junction board according to claim 2, wherein said connecting terminals are formed into bumps by plating said projecting opposite ends with a conductive metal.

4. The manufacturing method for a magnetic head junction board according to claim 3, further comprising the step of providing the outer surfaces of said bump-shaped connecting terminals with a corrosion-resistant metal film.

5. The manufacturing method for a magnetic head junction board according to claim 1, wherein said connecting terminals are formed into bumps by plating said projecting opposite ends with a conductive metal.

6. The manufacturing method for a magnetic head junction board according to claim 5, further comprising the step of providing the outer surfaces of said bump-shaped connecting terminals with a corrosion-resistant metal film.

7. A method for the manufacture of a magnetic head junction board for electrically and mechanically coupling a magnetic head suspension to a circuit wiring pattern of a read/write amplifier substrate, said method comprising the steps of:

preparing a laminated plate, in which one surface of a flexible insulating base material abuts a springy metal layer and the other surface of said base material supports a conductive layer, said metal layer having a pair of opposite ends;

forming a desired circuit wiring pattern on the conductive layer of said laminated plate and forming a groove, which matches a predetermined contour, in said springy metal layer;

providing the outer surface of said circuit wiring pattern with a surface protecting layer, said protecting layer having holes to partly expose the ends of the circuit wiring pattern at the portions which correspond to both ends of said springy metal layer;

filling said holes with conductive metal to form connecting terminals first ends of said terminals being electrically connected to said circuit wiring pattern and the opposite ends of said terminals projecting outwardly beyond the surface of said surface protecting layer;

employing an excimer laser beam to ablate the portions of said flexible insulating base material and the surface protecting layer which are positioned in the area of said groove so as to obtain a predetermined configuration; and bending said springy metal layer to a predetermined shape.

8. The manufacturing method for a magnetic head junction board according to claim 7, wherein said surface protecting layer is produced by sequentially carrying out the application of a photosensitive resin, drying, exposure, development, and curing.

9. The manufacturing method for a magnetic head junction board according to claim 7, wherein said outwardly projecting opposite ends of said connecting terminals are formed into bumps by plating with a conductive metal.

10. A manufacturing method for a magnetic head junction board according to claim 9, further comprising the step of providing the outer surfaces of said bump-shaped connecting terminals with a corrosion-resistant metal film.

11. The manufacturing method for a magnetic head junction board according to claim 7, wherein said outwardly projecting opposite ends of said connecting terminals are formed into bumps by plating with a conductive metal.

12. The manufacturing method for a magnetic head junction board according to claim 11, further comprising the step providing the outer surfaces of said bump-shaped connecting terminals with a corrosion-resistant metal film.

* * * * *